United States Patent [19]

Schneider

[11] Patent Number: 5,369,491

[45] Date of Patent: Nov. 29, 1994

[54] METHOD FOR MEASURING THE RECIPROCAL DISPLACEMENT OF THE LAYERS OF A MULTILAYER ARRANGEMENT AND APPARATUS FOR PERFORMING THIS METHOD

[76] Inventor: Klaus Schneider, Ritterstrasse 11, D-1000 Berlin 61, Germany

[21] Appl. No.: 857,338

[22] Filed: Mar. 25, 1992

[30] Foreign Application Priority Data

Mar. 27, 1991 [DE] Germany ............................ 4110441

[51] Int. Cl.⁵ ...................... G01B 11/22; G01N 21/88
[52] U.S. Cl. ..................................... 356/378; 356/241
[58] Field of Search ............... 356/372, 375, 394, 237, 356/239, 241, 373, 378; 250/561, 562, 563; 358/101, 106, 107

[56] References Cited

U.S. PATENT DOCUMENTS

| | | | |
|---|---|---|---|
| 4,145,714 | 3/1979 | MacDonald et al. | 356/241 |
| 4,560,273 | 12/1985 | Ando et al. | 356/241 |
| 4,865,448 | 9/1989 | Akutsu et al. | 356/241 |
| 4,930,890 | 6/1990 | Hara et al. | 356/241 |

OTHER PUBLICATIONS

IBM Technical Disclosure Bulletin "Optical System for Viewing Dielectric Smear in Printed Circuit Board Hole and Delete the Smear" vol. 25 No. 9, Feb. 1983, Johnson et al.

*Primary Examiner*—Richard A. Rosenberger
*Assistant Examiner*—Hoa Q. Pham
*Attorney, Agent, or Firm*—Marshall & Melhorn

[57] ABSTRACT

A method for measuring the reciprocal displacement of the layers of a multilayer arrangement provided with conductors in described. The knowledge of the displacement makes it possible to in each case fix a suitable position for the holes through the multilayer arrangement to be subsequently produced and which are used for the electrical connection of the conductor planes. For this purpose, in a clearly defined position, each layer carries an optically recognizable pattern, said patterns at least partly being superimposed in the multilayer arrangement. In the multilayer arrangement at least one inspection hole is produced, which intersects the pattern of each layer. The cutting edges of each pattern are optically detected in the inspection hole and the position thereof is used for determining the reciprocal displacement of the layers.

20 Claims, 2 Drawing Sheets

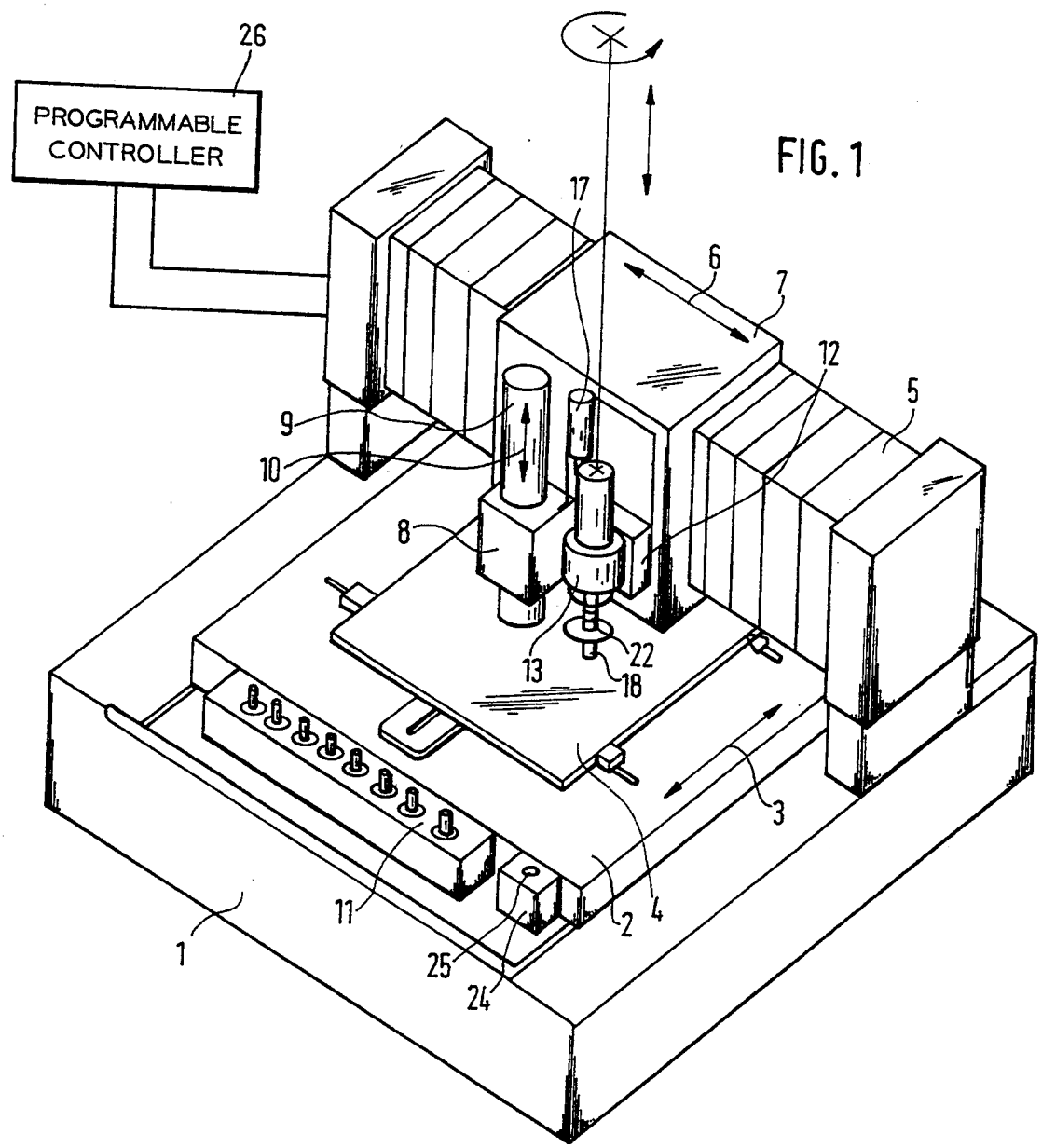

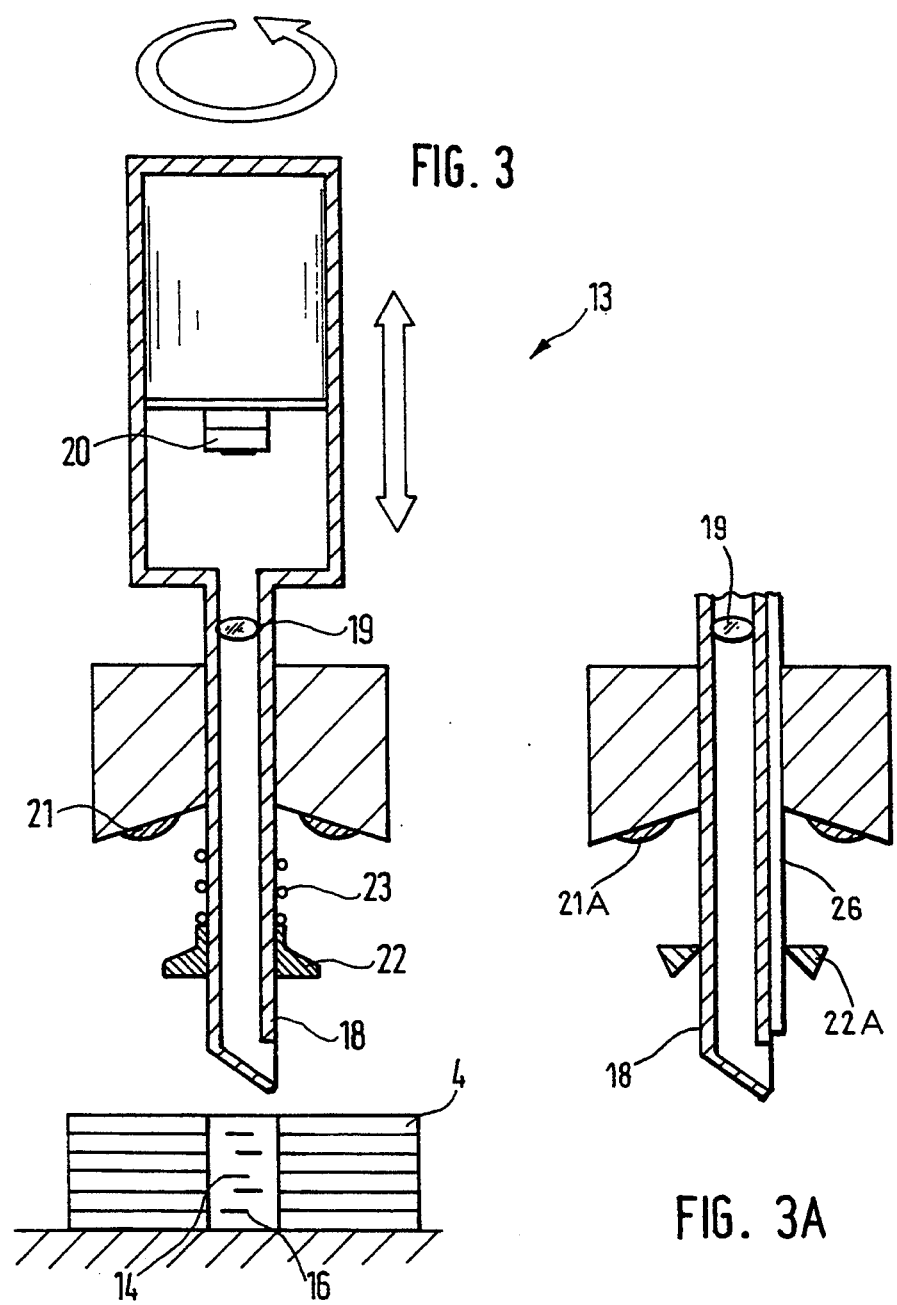
FIG. 3
FIG. 3A
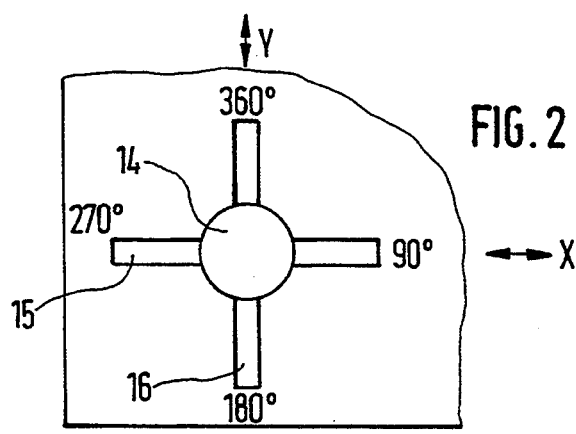
FIG. 2

METHOD FOR MEASURING THE RECIPROCAL DISPLACEMENT OF THE LAYERS OF A MULTILAYER ARRANGEMENT AND APPARATUS FOR PERFORMING THIS METHOD

SUMMARY OF THE INVENTION

The conductors of the individual layers of multilayer arrangement are so electrically interconnected after lamination, that holes are drilled at the connection points and are then provided with a metallic lining. However, this method requires an adequate registration of the conductors to be connected in the vicinity of the connection points. If this is not the case, e.g. due to the addition of tolerances, a planned connection cannot be brought about or is so weak that after a relatively short period of operation a failure occurs. The resulting high wastage rate can be reduced if the reciprocal displacement of the individual layers of the multilayer arrangement is known, so that the positions of the holes to be drilled in the drilling program can be determined in such a way that the contact between the lining of the holes and the individual conductors is as uniform as possible.

In order to achieve this objective, hitherto suitable measuring marks have been made in the marginal area of the inner layer of the multilayer arrangement and the shadows formed in the light cone of a punctiform X-radiation source have been measured. By evaluating the image obtained the displacement and distortion of each individual inner layer can be determined and from it the possibly necessary changes to the drilling program. The combination of such a radiograph evaluation with a printed circuit board drilling machine is technically very complicated and therefore involves relatively high costs.

The problem of the present invention is consequently to provide a method for measuring the reciprocal displacement of the layers of a multilayer arrangement provided with conductors in order to in each case fix the appropriate position for the holes through the multilayer arrangement to be subsequently produced and which are used for the electrical connection of the conductor planes, so that the displacement can be accurately determined in a simple manner and with limited apparatus expenditure.

According to the invention this problem is solved by the positioning and optical scanning features of the present invention. Advantageous further developments of the inventive method and constructions of a preferred apparatus for performing the method are also described herein.

The invention is characterized in that each layer carries in a clearly defined position an optically recognizable pattern, said patterns at least partly overlapping in the multilayer arrangement and in the latter is produced at least one inspection hole, so that the latter intersects the patterns of each layer and the cutting edges of each pattern are optically determined in the inspection hole. As each pattern has a clearly defined position relative to the conductors of the associated layer, from the reciprocal displacement of the patterns of the different layers conclusions can be drawn regarding the reciprocal displacement of the conductors of said layers. As the cutting edges of the individual patterns used for the measurement are produced only following the lamination of the individual layers to a multilayer arrangement by means of a common working process, an error source resulting from the latter is practically excluded.

Preferably the pattern of each layer comprises an intersection of two strip or stripe patterns at right angles to one another, the strip pattern comprising at least three parallel lines or marks with an e.g. 0.01 inch width and 0.01 inch insulation spacing and in which in the case of displacement-free arrangement of each layer the intersections or crosses completely cover one another and the centre axis of the inspection hole having a larger diameter than the strip width coincides with the intersection points. Thus, for each layer in the inspection hole are obtained 4×3 cutting marks, which are in each case reciprocally displaced by 90°. The in each case facing three cutting mark patterns are used for determining the displacement of the layers in a direction at right angles to their connecting line. The triple mark pattern supplies redundant information for the automatic image evaluation if, as a result of dirtying or etching errors, part of the cutting mark pattern is no longer recognizable.

Each layer appropriately has at least two cruciform patterns and a corresponding number of inspection holes are made. This makes it possible not only to determine a reciprocal displacement of the layers in the directions predetermined by the cruciform patterns, but also any displacement as a result of mutual rotation.

It is advantageous to produce the patterns from the same material as and simultaneously with the conductors, which are electrically insulated against one another. Therefore no additional operation is required for the formation of the patterns.

BRIEF DESCRIPTION OF THE DRAWINGS

The invention is described in greater detail hereinafter relative to a non-limitative embodiment and the attached drawings, wherein show:

FIG. 1 A printed circuit board drilling machine with a measuring device for the reciprocal displacement of the layers of a multilayer arrangement in perspective view.

FIG. 2 A plan view of an inspection hole.

FIG. 3 The optical system for determining the cutting edges of the patterns in the inspection hole in a sectional representation.

FIG. 3A A sectional representation of an alternative optical system for use with opaque layer material, and also showing the air nozzle for cleaning the periscope.

DETAILED DESCRIPTION OF PREFERRED EMBODIMENT OF THE INVENTION

A drilling bench 2 is displaceably mounted in the direction of the arrow 3 (Y-direction) on a base plate 1. Onto the drilling bench 2 is clamped a multilayer printed circuit board 4 to enable the drilling work to take place.

A fixed bridge 5 covering the drilling bench 2 is supported on the base plate 1. The part of the bridge 5 parallel to the drilling bench 1 carries a sleeve-like mounting support 7 displaceable in the direction of the arrow 6 (X-direction) and to which is fixed a shoulder 8, in which a drilling spindle 9 is movably mounted in the direction of the arrow 10 (Z-direction). The multilayer printed circuit board 4 and a drill fixed in the drilling spindle 9 are consequently movable against one another in the so X direction along arrow 6, Y direction along arrow 3, and Z direction along arrow 10, so that drilling can take place at any random paint and up to any random depth on the circuit board 4. The base plate 1 also carries a tool changing station 11, which has various tools for reception in the drilling spindle 9.

The printed circuit board drilling machine, which to this extent is known, carries on the mounting support 7 by means of a slide 12 displaceable with respect thereto in the Z-direction, an optical system 13, which is fitted alongside the drilling spindle 9. A pneumatically operable locking means (not shown) couples the slide 12 to the drive of the drilling spindle 9 in the Z-direction, so that, after locking in the Z-direction, the optical system 13 can be positioned with an accuracy of ±1/100 mm over the entire 20 mm path.

The system 13 is used for the optical determination of the cutting edges of patterns in at least one inspection hole 14, which is produced in the multi-layer printed circuit board 4 fixed to the drilling bench 2 after lamination has taken place. FIG. 2 is a plan view of a pattern of a layer and the associated inspection hole 14. The pattern comprises two strip patterns 15, 16 intersecting one another at right angles and in each case having at least three lines or marks with e.g. a length of 8 mm and a strip pattern width of 0.05 inch. The pattern is copied in the film used for forming the layer conductors and produced in the same way as said conductors. The coordinates of the centres of the cruciform pattern are recorded in the drilling program. The patterns of the individual layers in the multilayer printed circuit board, are exactly superimposed, if there is no displacement between the said layers.

The laminated multilayer printed circuit board 4 is now clamped on the drilling bench 2 and the inspection holes 14 are drilled through the pattern in such a way that the centre line of said holes passes through the centres of the cruciform pattern stored in the drilling program. The diameter of the inspection holes 14 is between the width of the length of the strips 15 and 16 and is e.g. 6 mm. Thus, per pattern, i.e. per layer in an inspection hole 14, there are four thin cutting edge patterns in the form of optically visible marks, namely in each case three marks in each quadrant. If there is no displacement between the individual layers, the cutting edges of the individual patterns are precisely superimposed. A divergence from this orientation results from a corresponding displacement of the associated layer. The reference line for the divergence occurs in the plane passing through the stored centres of the pattern in the strip longitudinal direction.

At the cutting edges of a strip, there is a displacement in a direction at right angles to the strip longitudinal direction, e.g. from the cutting edges of the strip 15 a displacement in the Y-direction and from those of the strip 16 the displacement in the X-direction.

The following problem arises on drilling the inspection holes 14. The cutting edge of the copper band forming the pattern and having a surface of e.g. 200×10 um is only sharp at the end first encountered by the drill (front end), whereas at the rear end there is an irregular burr with a length of up to 50 um. Therefore the rear end is unusable for determining the displacement. It is also inadequate to carry out an evaluation in such a way that only the front end of the cutting edge is determined and to this is added half the edge of said cutting edge, because any imaging errors of the conductor widths (illumination errors, undercuttings, etc.) would pass as errors into the measurement result. Therefore the optical system 13 is designed in such a way that it can rotate, so that for measuring the displacement in the X-direction in each case the front ends of the cutting edges of the strip 16 are evaluated at 180° and 360° and in the Y-direction in each case the front ends of the cutting edges of the strip 15 at 90° and 270°. Only the two front ends of the facing cutting edges give the precise information concerning the displacement of the pattern in the X or Y-direction and it is possible to calculate the precise position of the pattern by means of image evaluation.

There are at least two inspection holes 14, so that by a comparison of the in each case measured displacement, it is possible to establish to what extent the individual layers are rotated with respect to one another.

The optical system 13 is shown in greater detail in FIG. 3. By means of the slide 12, it is displaceable in the Z-direction and is also rotatable and can be positioned in four positions reciprocally displaced by in each case 90°, in which it is possible to scan a row of superimposed cutting edges. A stepping motor 17 (FIG. 1) is provided for rotation and corresponding positioning.

The optical system 13 essentially comprises a miniature periscope 18, a precision lens 19, a high-resolution CCD camera 20 and, in the case of transparent material a glass fibre illumination 21 with diaphragm 22, or in the case of non-transparent material an incident illumination with a beam splitter 22A and light source 21A, As shown in FIG. 3A. The diaphragm 22 is displaceably positioned on the periscope 18 and by a spring 23 is pretensioned towards its tip so that, if the periscope 18 is introduced into an inspection hole 14 of the multilayer printed circuit board 4, it covers the gap between the inner wall of the inspection hole 14 and the periscope 18, whose diameter is e.g. 4 mm, in order to prevent scattered light from penetrating the gap. If the substrate material is transparent and the light entrance face is free from circuit board material, the light emitted by the ring lamp 21 passes round the diaphragm 22 into the circuit board 4 and the inspection hole is illuminated.

To the periscope 18 is also fitted an air nozzle 26 which, after each measuring process, blows free the lateral light entrance face and consequently prevents undesired dust deposits.

The substrate material for the layers of the multilayer printed circuit board 4 is transparent and the perimeter of the inspection holes 14 is free from conductor material, so that light emitted by the ring lamp 21 passes round the diaphragm 22 into the circuit board 4 and illuminates the inspection holes 14. The cutting edges of the strips 15, 16 are clearly visible and are scanned by the periscope 18, which for this purpose has been lowered into the inspection hole 14 and travels through the same in each of the four rotation positions in the Z-direction. Thus, the position of each individual cutting edge in an inspection hole is optically determined and can be evaluated for establishing the displacement of the associated layer.

Level with the tool changing station 11 on the base plate 1 is fixed a calibration block 24 (FIG. 1), which contains in a calibration hole 25 calibration marks used for adjusting or setting the periscope 18. Errors of the following operating quantities can be established and stored for subsequent compensation of the measured results: image scale of the optical system, zero offset of the machine and accuracy of the periscope rotation.

If the substrate material of the layers of the multilayer printed circuit board is opaque, the inspection hole must be illuminated by means of a suitable incident illumination for the optical determination of the cutting edges of the pattern.

I claim:

1. A method for measuring the reciprocal displacement of a plurality of planar layers containing a pattern of conductors, the planar layers being aligned and constructed into a multilayer circuit board and positioned on a unique printed circuit board drilling machine for measurement of reciprocal displacement prior to drilling at least one connecting hole to facilitate electrical connection between the planar layers, the method for measuring the reciprocal displacement of the planar layers in the multilayer circuit board comprising the steps of:

a) forming two or more test patterns on a surface of a plurality of layers;
b) constructing a multilayer circuit board from the plurality of planar layers such that the test patterns on each of the planar layers are superimposed in the multilayer circuit board;
c) positioning the multilayer circuit board on the drilling machine;
d) drilling at least two inspection holes in the multilayer circuit board at the test pattern;
e) positioning a rotatable periscope within the inspection holes;
f) illuminating the inspection hole to facilitate observation of the test patterns through the periscope;
g) observing the position and alignment of the test patterns using an optical scanner system; and
h) evaluating a plurality of the images obtained to determine the displacement and distortion of the planar layers used to form the multilayer circuit board.

2. The method for measuring reciprocal displacement in a multilayered circuit board defined in claim 1 wherein the step of forming a test pattern includes forming two sets of parallel, spaced-apart strips positioned perpendicular to each other on a surface of the planar layers, the inspection hole having a diameter greater than the width of strips in the test pattern.

3. The method for measuring reciprocal displacement in a multilayered circuit board defined in claim 2 wherein the step of forming two or more test patterns includes forming at least two test patterns on each planar layer in the multilayered circuit board, the patterns having a width of approximately 0.01 inch and spacing between adjacent parallel strips of 0.01 inch, and the step of drilling the inspection holes includes drilling the number of inspection holes corresponding to the number of test patterns.

4. The method for measuring reciprocal displacement in a multilayered circuit board defined in claim 2 wherein the step of forming one or more test patterns includes forming each test pattern in a three strip by three strip pattern such that each layer forms a plurality of marks in a three by four pattern in the inspection hole, and wherein the step of positioning the periscope includes positioning the periscope and observing in each layer two marks of the pattern which are perpendicular to one another.

5. The method for measuring reciprocal displacement in a multilayered circuit board defined in claim 4 wherein the step of observing the pattern marks in the inspection holes is limited to the four initial marks in each planar layer, the marks being spaced ninety degrees apart on the surface of the inspection hole such that a first and third mark are space one hundred and eighty degrees apart and provide displacement information on a first axis on the planar layer and a second and fourth marks are spaced one hundred and eighty degrees apart and provide displacement information on a second axis on the planar layer and perpendicular to the first axis.

6. The method for measuring reciprocal displacement in a multilayered circuit board defined in claim 1 wherein the step of forming one or more test patterns on a surface of a plurality of layers includes forming the patterns concurrently with, and from the same material as, the conductors on the planar layers such that the patterns are electrically insulated from the conductors.

7. The method for measuring reciprocal displacement in a multilayered circuit board defined in claim 1 wherein the step of positioning the periscope includes positioning the periscope at variable depths within the inspection holes such that displacement information is obtained for each of the planar layers of the multilayered circuit board.

8. The method for measuring reciprocal displacement in a multilayered circuit board defined in claim 7 wherein the step of positioning the periscope includes rotating the periscope in the inspection hole about an axis perpendicular to the planar layers for a complete rotation of the periscope at each layer of the multilayered circuit board, the rotation occurring in ninety degree increments.

9. The method for measuring reciprocal displacement in a multilayered circuit board defined in claim 8 wherein the step of observing the pattern in the inspection hole includes optically transmitting the images viewed by the miniature periscope through a lens to a CCD camera.

10. The method for measuring reciprocal displacement in a multilayered circuit board defined in claim 1 wherein the planar layers are transparent and the step of observing the position and alignment of the test pattern includes the additional step of illuminating an inner wall of the inspection hole from a source of light adjacent the layered circuit board.

11. The method for measuring reciprocal displacement in a multilayered circuit board defined in claim 1 wherein the planar layers are opaque and the step of observing the position and alignment of the test pattern includes the additional step of orienting a light source in the direction of an inner wall of the inspection hole by using a beam splitter to illuminate the inner wall of the inspection hole.

12. The method for measuring reciprocal displacement in a multilayered circuit board defined in claim 1 including the additional step of calibrating the periscope prior to positioning the periscope in the inspection hole.

13. A method for positioning one or more connection holes in a multilayer circuit board by measurement of reciprocal displacement for a plurality of planar layers used to construct the multilayer circuit board, the multilayer circuit board being positioned on a unique printed circuit board drilling machine for measurement of reciprocal displacement of the planar layers prior to drilling at least one connecting hole between the planar layers, the method for positioning one or more connection holes in a multilayer circuit board by measurement of a reciprocal displacement:

a) forming two or more test pattern on a surface of a plurality of planar layers;
b) constructing a multilayer circuit board from the plurality of planar layers such that the test patterns on each of the planar layers are superimposed in the multilayer circuit board;

c) positioning the multilayer circuit board on the drilling machine;

d) drilling at least two inspection holes in the multilayer circuit board at the test pattern;

e) positioning a rotatable periscope within the inspection holes;

f) illuminating the inspection hole to facilitate observation of the test patterns through the periscope;

g) observing the position and alignment of the test patterns using an optical scanner system;

h) evaluating a plurality of images obtained to determine the displacement and distortion of the planar layers used to form the multilayer circuit board;

i) determining the position of the connecting holes to be drilled in the multilayer circuit board to achieve a strong and uniform connection between the planar layers; and j) drilling the connecting holes in the desired position on the multilayer circuit board.

14. A drilling apparatus for measuring reciprocal displacement of planar layers in a multilayer circuit board, and for positioning and drilling connecting holes in the multilayer circuit board to electrically connect the planar layers, said drilling apparatus comprising:

a) a base;

b) retention means for retaining and positioning the multilayer circuit board, said retention means including a movable bench having a planar surface with clamps for mounting the multilayer circuit board on the bench such that the planar layers of the multilayer circuit board are generally parallel to the planar surface of the bench;

c) support means extending from said base, said support means including movable mounting support positioned opposite the retention means such that the multilayer circuit board is mounted between the movable bench and the movable mounting support;

d) drilling means for drilling variable depth holes in the multilayer circuit board, said drilling means mounted on the mounting support and including a drill position perpendicular to an outer surface of the planar layers, and a spindle drive for positioning and powering the drill;

e) optical sensor means, including an illuminating device, a miniature periscope, a lens, and a high-resolution CCD camera for reading a pattern in an inspection hole drilled in the multilayer circuit board and generating a measurement signal for evaluation; and f) programmable control means in electrical communication with said retention means, said support means, said drilling means, and said optical sensor means, said programmable control means for storing drilling programs to control the drilling of the multilayer circuit board, for calculating the position of the .pattern by means of image evaluation, and for establishing and storing information regarding image scale of the optical system, offset of the drilling spindle, and accuracy of the periscope rotation whereby said retention means positions the multilayered circuit board, said drilling means drills at least two inspection holes in the multilayered circuit board, said optical sensor means reads a pattern in the inspection holes, and the programmable controller evaluates the signals from the optical sensor means and generates a control signal to said drill means for drilling connecting holes in the multilayer circuit board.

15. The drilling apparatus for measuring reciprocal displacement of planar layers in a multilayer circuit board defined in claim 14 including a drive motor whereby a motor positions both said drilling means and said optical sensor means.

16. The drilling apparatus for measuring reciprocal displacement of planar layers in a multilayer circuit board defined in claim 14 wherein said motor is a stepping motor to provide both linear positioning and rotational movement to said drilling means and said optical sensor means.

17. The drilling apparatus for measuring reciprocal displacement of planar layers in a multilayer circuit board defined in claim 14 wherein the illuminating device in said optical sensor means includes a ring lamp surrounding the periscope.

18. The drilling apparatus for measuring reciprocal displacement of planar layers in a multilayer circuit board defined in claim 14 wherein the illuminating device in said optical sensor means includes a displaceable diaphragm resiliently pre-tensioned in the direction of the multilayer circuit board, said diaphragm surrounding the periscope to cover a gap between an inspection hole in the multilayered circuit board and the periscope.

19. The drilling apparatus for measuring reciprocal displacement of planar layers in a multilayer circuit board defined in claim 14 wherein said optical sensor means includes an air nozzle for blowing dirt particles away from a light entrance to the periscope.

20. The drilling apparatus for measuring reciprocal displacement of planar layers in a multilayer circuit board defined in claim 14 including a calibration means mounted on said base for adjusting the periscope in said optical sensor means.

* * * * *